(12) United States Patent
Teymouri et al.

(10) Patent No.: US 12,407,292 B2
(45) Date of Patent: Sep. 2, 2025

(54) DESATURATION FAULT RESPONSE

(71) Applicant: Rivian IP Holdings, LLC, Plymouth, MI (US)

(72) Inventors: Armin Teymouri, Los Angeles, CA (US); Boru Wang, Pasadena, CA (US); Chia-Chou Yeh, Torrance, CA (US)

(73) Assignee: Rivian IP Holdings, LLC, Plymouth, MI (US)

( * ) Notice: Subject to any disclaimer, the term of this patent is extended or adjusted under 35 U.S.C. 154(b) by 149 days.

(21) Appl. No.: 18/142,136

(22) Filed: May 2, 2023

(65) Prior Publication Data

US 2024/0297607 A1 Sep. 5, 2024

Related U.S. Application Data

(60) Provisional application No. 63/449,521, filed on Mar. 2, 2023.

(51) Int. Cl.
| | |
|---|---|
| *H02P 29/028* | (2016.01) |
| *G01R 31/42* | (2006.01) |
| *H02P 23/14* | (2006.01) |
| *H02P 27/06* | (2006.01) |

(52) U.S. Cl.
CPC ............ *H02P 29/028* (2013.01); *G01R 31/42* (2013.01); *H02P 23/14* (2013.01); *H02P 27/06* (2013.01)

(58) Field of Classification Search
CPC ........ H02P 29/028; H02P 23/14; H02P 27/06; G01R 31/42
USPC ......................................................... 318/445
See application file for complete search history.

(56) References Cited

U.S. PATENT DOCUMENTS

| | | | | |
|---|---|---|---|---|
| 2005/0281065 | A1* | 12/2005 | Nojima ................ | H02H 7/1227 363/98 |
| 2008/0304189 | A1* | 12/2008 | Tang .................... | H02H 7/1222 318/434 |
| 2013/0009580 | A1* | 1/2013 | De Wergifosse ..... | H02M 7/493 318/400.26 |
| 2016/0365787 | A1* | 12/2016 | Geske .................... | H02M 1/32 |
| 2022/0094297 | A1* | 3/2022 | Lacaux .................... | H02P 3/22 |

OTHER PUBLICATIONS

Kageyama (WO 2020026755 A1).Power Conversion Device and Ground Fault Location Diagnosis Method (Year: 2020).*
Bhalla et al., "IGBT behavior during desat detection and short circuit fault protection," Proceedings of the 10th International Symposium on Power Semiconductor Devices and ICs. ISPSD'98 (IEEE Cat. No. 98CH36212), pp. 245-248 (1998).
Huang et al., "Comprehensive Analysis and Improvement Methods of Noise Immunity of Desat Protection for High Voltage SiC MOSFETs With High DV/DT," in IEEE Open Journal of Power Electronics, vol. 3, pp. 36-50 (2022).

* cited by examiner

*Primary Examiner* — Jorge L Carrasquillo
(74) *Attorney, Agent, or Firm* — Haley Guiliano LLP

(57) ABSTRACT

Systems and methods for controlling one or more inverters in response to detecting a desaturation (DESAT) fault are disclosed herein. A DESAT fault of an inverter coupled to a motor is detected. In response to detecting the DESAT fault, all driving switches of the inverter are instructed to open. The driving switch that failed and a type of failure are determined based on current of the motor during a predetermined time period after instructing all of the driving switches to open, and the remaining driving switches are controlled based on which switch failed and the type of failure.

16 Claims, 6 Drawing Sheets

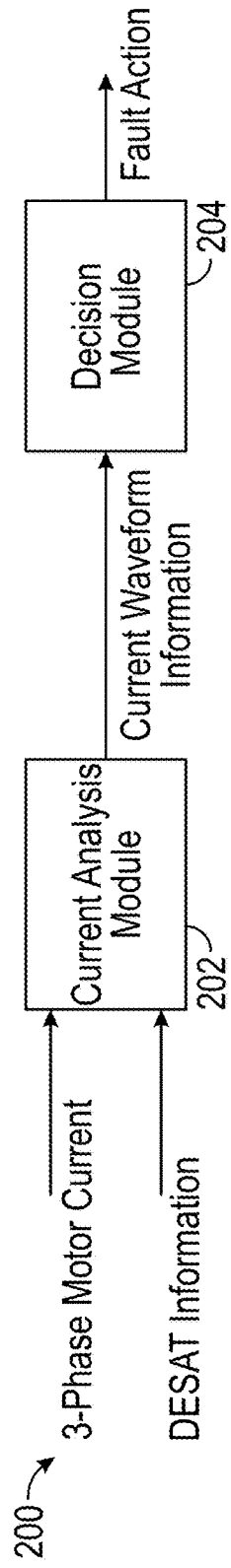

FIG. 2

| | DESAT Type | Fault Action | | Inverter Health |
|---|---|---|---|---|
| | | Speed≤1krpm | Speed>1krpm | |
| Single Switch DESAT | Lower Switch Fail Short | OPEN | Short Lo | Not Operational |
| | Higher Switch Fail Short | OPEN | Short Hi | Not Operational |
| | Lower Switch Fail OPEN | Speed Dependent Hi | | Operational |
| | Higher Switch Fail OPEN | Speed Dependent Lo | | Operational |
| | | Speed<1krpm | Speed>1krpm | |
| Multiple Switch DESAT | Two Fail Shorts, Lower Switches | OPEN | Short Lo | Not Operational |
| | Two Fail Short, Higher Switches | OPEN | Short Hi | Not Operational |
| | Two Fail OPEN | OPEN | | Operational |
| | Two Fail Short, Opposite Sides | OPEN | | Not Operational |
| | | Speed<1krpm | Speed>1krpm | |
| | Fail Short Higher Switch, Fail OPEN | OPEN | Short Hi | Not Operational |
| | Fail Short Lower Switch, Fail OPEN | OPEN | Short Lo | Not Operational |
| | Two Fail Short, Same Leg | None (Not Compliant) | | Not Operational |

FIG. 3

DESATURATION FAULT RESPONSE

CROSS-REFERENCE TO RELATED APPLICATIONS

This application claims priority to U.S. Provisional Patent Application No. 63/449,521, filed on Mar. 2, 2023, the entire contents of which is hereby expressly incorporated by reference in its entirety.

INTRODUCTION

The present disclosure relates to systems and methods for controlling one or more inverters, each coupled to a respective motor, and more particularly, to systems and methods for controlling one or more inverters in response to detecting a desaturation (DESAT) fault.

SUMMARY

Inverters (e.g., power inverters) are utilized to provide power to electric motors of a vehicle (e.g., by inverting power from an onboard battery). However, if an inverter suffers a fault where a driving switch opens into a short circuit (e.g., a driving switch experiences a DESAT fault), the inverter may be damaged unless action is quickly taken.

In one approach, to prevent an inverter from being damaged, an inverter controller may immediately instruct all driving switches of the inverter to open in response to detecting a DESAT fault. However, depending on the type of DESAT fault and the speed of the vehicle, this action may cause large asymmetrical short circuit currents in a motor connected to the inverter, which may damage the motor, battery, or other vehicle hardware as the vehicle slows down (e.g., the motor may act as an alternator, and the anti-parallel diodes of the inverter may act as an uncontrolled rectifier bridge to deliver regenerative power until the wheel(s), which are coupled to the motor, stop turning). Additionally, for vehicles utilizing more than one motor (e.g., a left-side motor and a right-side motor), an open command to all inverter driving switches may result in unbalanced torques between the motors as the vehicle comes to a stop. In the case of left and right side motors, this may cause vehicle yaw.

For improved protection and usability, the present disclosure provides systems and methods for controlling one or more inverters in response to detecting a DESAT fault.

This disclosure is directed to systems and methods for controlling one or more inverters, each coupled to a respective motor, and more particularly, to systems and methods for controlling one or more inverters in response to detecting a DESAT fault. The system analyzes motor currents post-DESAT fault during an analysis window to determine which driving switch failed and a type of failure (e.g., fail open or fail short). Based on the determination, the system controls driving switches of the one or more inverters to minimize the duration of fault current and, in the case of two inverters, minimizes unbalanced torque (e.g., supplied to wheels of a vehicle).

In some embodiments, a method is provided that includes detecting a DESAT fault of an inverter coupled to a motor, instructing all driving switches of the inverter to open in response to detecting the DESAT fault, determining which driving switch failed and a type of failure based on the current of the motor during a predetermined time period after instructing all of the driving switches to open, and controlling the remaining driving switches based on which switch failed and the type of failure.

In some embodiments, the current of the motor may include a plurality of currents each corresponding to a phase of the motor, and determining which driving switch failed and the type of failure may include analyzing the current of the motor.

In some embodiments, the predetermined time period (e.g., 70 ms) may begin after a buffer time period (e.g., 2 ms) has passed since instructing all the driving switches to open.

In some embodiments, the inverter may include a plurality of legs, and each of the plurality of legs may include a high-side driving switch and a low-side driving switch. In some embodiments, in response to determining that a low-side driving switch failed and the type of failure is a fail short, controlling the remaining driving switches may include, in response to a speed of the motor being at or below a threshold speed, controlling the remaining driving switches to remain open; and, in response to the speed of the motor being above the threshold speed, controlling the remaining low-side driving switches to close and all of the high-side driving switches to remain open.

In some embodiments, in response to determining that a high-side driving switch failed and the type of failure is a fail short, controlling the remaining driving switches may include, in response to the speed of the motor being at or below a threshold speed, controlling the remaining driving switches to remain open; and in response to the speed of the motor being above the threshold speed, controlling the remaining high-side driving switches to close and all of the low-side driving switches to remain open.

In some embodiments, in response to determining that a low-side driving switch failed and the type of failure is a fail open, controlling the remaining driving switches may include monitoring a speed of the motor; in response to the speed of the motor being above a threshold speed, controlling all of the high-side driving switches to close and the remaining low-side driving switches to remain open while the speed of the motor remains above the threshold speed; and in response to the speed of the motor being at or below the threshold speed, controlling all of the remaining switches to open or remain open (e.g., if already open).

In some embodiments, in response to determining that a high-side driving switch failed and the type of failure is a fail open, controlling the remaining driving switches may include monitoring a speed of the motor; in response to the speed of the motor being above a threshold speed, controlling all of the low-side driving switches to close and the remaining high-side driving switches to remain open while the speed of the motor remains above the threshold speed; and in response to the speed of the motor being at or below the threshold speed, controlling all of the remaining switches to open or remain open.

In some embodiments, the method may further include determining whether the inverter is operational based on the determined type of failure; in response to determining that the inverter is operational, resetting the inverter; and in response to determining that the inverter is not operational, disabling the inverter and generating a notification that the inverter is not operational.

In some embodiments, the inverter may be a first inverter and the motor may be a first motor; and the method may further include controlling driving switches of a second inverter coupled to a second motor to correspond to the driving switches of the first inverter.

In some embodiments, each of first motor and the second motor may be a three-phase electric motor, and the first motor may be coupled to a first wheel of a vehicle and the second motor may be coupled to a second wheel of the vehicle.

In some embodiments, a system is provided. The system includes an inverter configured to be coupled to a motor, and control circuitry configured to detect a DESAT fault of the inverter, instruct all driving switches of the inverter to open in response to detecting the DESAT fault, determine which driving switch failed and a type of failure based on current of the motor during a predetermined time period after instructing all of the driving switches to open, and control the remaining driving switches based on which switch failed and the type of failure.

In some embodiments, the current of the motor may include a plurality of currents each corresponding to a phase of the motor, and the control circuitry may be configured to determine which driving switch failed and the type of failure by analyzing the current of the motor during.

In some embodiments, the inverter may include a plurality of legs, and each of the plurality of legs may include a high-side driving switch and a low-side driving switch. In some embodiments, the control circuitry may be configured, in response to determining that a low-side driving switch failed and the type of failure is a fail short, to control the remaining driving switches by, in response to a speed of the motor being at or below a threshold speed, controlling the remaining driving switches to remain open; and in response to the speed of the motor being above the threshold speed, controlling the remaining low-side driving switches to close and all of the high-side driving switches to remain open.

In some embodiments, the control circuitry may be configured, in response to determining that a high-side driving switch failed and the type of failure is a fail short, to control the remaining driving switches by, in response to the speed of the motor being at or below a threshold speed, controlling the remaining driving switches to remain open; and in response to the speed of the motor being above the threshold speed, controlling the remaining high-side driving switches to close and all of the low-side driving switches to remain open.

In some embodiments, the control circuitry may be configured, in response to determining that a low-side driving switch failed and the type of failure is a fail open, to control the remaining driving switches by monitoring a speed of the motor; in response to the speed of the motor being above a threshold speed, controlling all of the high-side driving switches to close and the remaining low-side driving switches to remain open while the speed of the motor remains above the threshold speed; and in response to the speed of the motor being at or below the threshold speed, controlling all of the remaining switches to open or remain open.

In some embodiments, the control circuitry may be configured, in response to determining that a high-side driving switch failed and the type of failure is a fail open, to control the remaining driving switches by monitoring a speed of the motor; in response to the speed of the motor being above a threshold speed, controlling all of the low-side driving switches to close and the remaining high-side driving switches to remain open while the speed of the motor remains above the threshold speed; and in response to the speed of the motor being at or below the threshold speed, controlling all of the remaining switches to open or remain open.

In some embodiments, the inverter may be a first inverter and the motor may be a first motor; each of first motor and the second motor may be a three-phase electric motor; the first motor may be coupled to a first wheel of a vehicle; and the second motor may be coupled to a second wheel of the vehicle. In some embodiments, the control circuitry may be further configured to control switches of a second inverter coupled to a second motor to correspond to the driving switches of the first inverter.

In some embodiments, a vehicle is provided. The vehicle includes a first inverter coupled to a first motor, the first motor being coupled to a first wheel of the vehicle; a second inverter coupled to a second motor, the second motor being coupled to a second wheel of the vehicle; and control circuitry. The control circuitry is configured to detect a DESAT fault of the first inverter, instruct all driving switches of the first inverter to open in response to detecting the DESAT fault, determine which driving switch of the first inverter failed and a type of failure based on the current of the first motor during a predetermined time period after instructing all of the driving switches of the first inverter to open, control the remaining driving switches of the first inverter based on which switch failed and the type of failure, and control all driving switches of the second inverter to correspond to the driving switches of the first inverter.

In some embodiments, the current of the motor may include a plurality of currents each corresponding to a phase of the motor, and the control circuitry may be configured to determine which driving switch of the first inverter failed and the type of failure by analyzing the current of the first motor.

In some embodiments, the control circuitry may be further configured to determine whether the first inverter is operational based on the determined type of failure; in response to determining that the first inverter is operational, reset the first inverter; and in response to determining that the first inverter is not operational, disable the first inverter and the second inverter and generate a notification that the vehicle is not operational.

BRIEF DESCRIPTION OF THE DRAWINGS

The above and other objects and advantages of the disclosure will be apparent upon consideration of the following detailed description, taken in conjunction with the accompanying drawings, in which like reference characters refer to like parts throughout, and in which:

FIG. 2 is an illustrative block diagram of control circuitry for implementing a control process for the drive system, in accordance with some embodiments of the present disclosure;

FIG. 3 shows an example of a fault action table, in accordance with some embodiments of the present disclosure;

DETAILED DESCRIPTION

Figure 1:
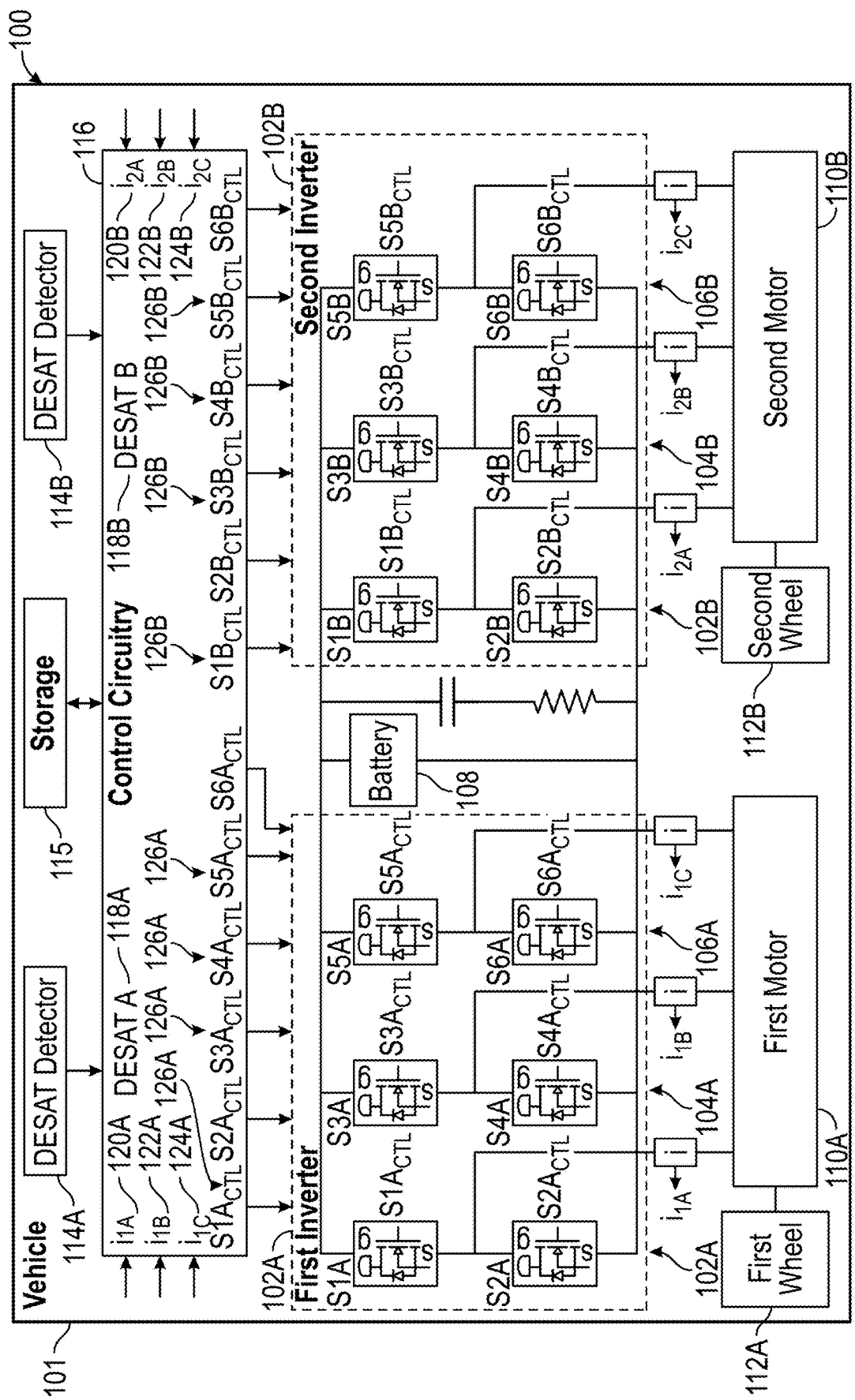
FIG. 1 shows a block diagram of components of a drive system of a vehicle for driving wheels of the vehicle and for detecting and responding to DESAT faults, in accordance with some embodiments of the present disclosure.

FIG. 1 shows a block diagram of components of a drive system 100 of a vehicle 101 for driving wheels of the vehicle 101 and for detecting and responding to DESAT faults, in accordance with some embodiments of the present disclosure. The vehicle 101 may be a car (e.g., a coupe, a sedan, a truck, an SUV, a bus), a motorcycle, an aircraft (e.g., a drone), a watercraft (e.g., a boat), or any other type of vehicle.

As shown, the drive system 100 includes a first inverter 102A configured to drive a first motor 110A coupled to a first wheel 112A (e.g., a left side wheel), a second inverter 102B configured to drive a second motor 110B coupled to a second wheel 112B (e.g., a right side wheel), a storage 115, and control circuitry 116 configured to control the first inverter 102A and the second inverter 102B to provide power export from a battery 108 to the first motor 110A and the second motor 110B. Although two motors are shown, it should be understood that the vehicle 101 may have any suitable number of motors (and corresponding inverters). For example, the vehicle 101 may alternatively include a single motor (e.g., first motor 110A), three motors, or four motors (e.g., for driving each individual wheel). For convenience of description, a vehicle having two motors, each driving a separate wheel, is described.

The storage 115 may be an electronic storage device. As referred to herein, the phrase "electronic storage device" or "storage device" should be understood to mean any device for storing electronic data, computer software, or firmware, such as random-access memory, read-only memory, solid state devices, or any other suitable fixed or removable storage devices, and/or any combination of the same. The storage 115 may be used to store various types of instructions, rules, and/or other types of data. For example, the storage 115 may store instructions for driving the first and second inverters 102A and 102B during normal operation, the fault action table 300 show in FIG. 3, speed thresholds for DESAT fault action, the length of the analysis window for the fault analysis, etc. In some embodiments, the control circuitry 120 executes instructions for an application stored in the storage 115 (e.g., to implement one or more of a plurality of modules). Specifically, the control circuitry 116 may be instructed by the application to perform the functions discussed herein. In some implementations, any action performed by the control circuitry 116 may be based on instructions received from the application. For example, the application may be implemented as software or a set of executable instructions that may be stored in the storage 115 and executed by the control circuitry 116 to implement steps of various methods described herein.

As shown, the first inverter 102A is a three-leg inverter, including a first leg 102A, a second leg 104A, and a third leg 106A. Although a three-leg inverter is shown, it should be understood that the first inverter 102A may include additional legs. As shown, the first leg 102A includes driving switches S1A and S2A, the second leg 104A includes driving switches S3A and S4A, and the third leg 106A includes driving switches S5A and S6A. Each of the driving switches S1A, S3A, and S5A are high-side driving switches, while each of the driving switches S2A, S4A, and S6A are low-side driving switches. The driving switches may be any suitable switch (e.g., insulated-gate bipolar transistors (IGBTs), wide-band-gap semiconductor devices, such as switches comprising Gallium Nitride, Silicon Carbide, or a combination thereof). The control circuitry 116 may generate switch control signals $S1A_{CTL}$-$S6A_{CTL}$ to drive driving switches S1A-S6A to generate desired motor currents $i_{1A}$, $i_{1B}$, and $i_{1C}$ (e.g., from the battery 108) for driving the first motor 110A. The first motor 110A may be coupled to the first wheel 112A of vehicle 101.

DESAT detector 114A may comprise suitable circuitry for detecting a DESAT fault (e.g., a DESAT condition or event) of any of the driving switches S1A-S6A of the first inverter 102A. For example, in the case of an IGBT, the DESAT detector 114A may detect a DESAT fault (or condition) in which the voltage across the driving switch rises above 5-15V while the gate voltage is high (e.g., which indicates that the current through the driving switch is no longer within safe operating levels). However, this is only one example of a DESAT detector, and any suitable circuitry for detecting a DESAT condition may be used. In response to detecting a DESAT fault, the DESAT detector 114A may output DESAT information (e.g., DESAT A signal 118A) to control circuitry 116).

As shown, the control circuitry 116 is configured to sense the three-phase motor current of the first motor 110A ($i_{1A}$, $i_{1B}$, and $i_{1C}$) via the first current input port 120A, the second current input port 122A, and the third current input port 124A (e.g., each coupled to one of the illustrated current detectors). As shown, the control circuitry 116 also includes a plurality of output ports 126A (including switching control ports for each of the switch control signals $S1A_{CTL}$-$S6A_{CTL}$), by which the control circuitry 116 provides respective switch control signals for driving switches S1A-S6A). The control circuitry 116 may also include additional input/output ports for sensing operating conditions/controlling the first inverter 102A.

As shown, the drive system 100 may include a second inverter 102B configured to drive the second motor 110B coupled to the second wheel 112B. In some embodiments, the configuration and operation of the second inverter 102B may correspond to the configuration and operation of the first inverter 102A. Thus, for simplicity, the operation and configuration of the second inverter 102B are not repetitively described. In some embodiments, the second inverter 102B may be different from the first inverter 102A (e.g., different configuration, different power rating, etc.). In some embodiments, the drive system 100 may include additional inverters (e.g., coupled to additional motors driving other wheels of the vehicle 101). In some embodiments, an inverter may be coupled to a motor that drives multiple wheels (e.g., front wheels or back wheels). In some embodiments, multiple motors may be coupled to a single wheel.

FIG. 2 is an illustrative block diagram of control circuitry for implementing a control process for the drive system 100, in accordance with some embodiments of the present disclosure. The control process may be implemented by control circuitry 116 of FIG. 1. As shown, a current analysis module 202 may receive DESAT information (e.g., a fault signal that includes information about a driving switch that has experienced a DESAT condition) and the three-phase motor current of the motor coupled to the inverter with the switch experiencing the DESAT condition (e.g., a DESAT fault). For example, if driving switch S1A of the first inverter 102a of FIG. 1 experiences a DESAT condition, the DESAT detector 114A of FIG. 1 may transmit a fault signal (e.g., DESAT signal 118A) indicating the DESAT fault to the current analysis module 202. The current analysis module 202 may also receive the three-phase motor current of the first motor 110A ($i_{1A}$, $i_{1B}$, and $i_{1C}$) via the first current input port 120A, the second current input port 122A, and the third current input port 124A. Immediately after detecting a DESAT condition, the control circuitry 116 may instruct all the driving switches of the first inverter 102A to open. In some embodiments, "all the driving switches" may refer to all the driving switches that are not experiencing a DESAT fault.

Based on the three-phase motor current and DESAT information, the current analysis module 202 may determine, after the control circuitry 116 instructs all of the driving switches of the first inverter 102A to open, which driving switch failed and a type of failure. For example, the current analysis module 202 analyzes the three-phase motor current during a predetermined time period (e.g., a current analysis window). For example, the current analysis module 202 may analyze the magnitude, polarity, and peaks of the motor currents to determine if the DESAT fault was a fail short (e.g., a dead switch) or a fail open (e.g., a reusable switch). In some embodiments, the current analysis module 202 may determine that the DESAT fault was triggered in error. In one example, for the illustrated application, a DESAT fault may cause asymmetrical currents of up to 1200 A. To account for noise and spikes, the three-phase motor current may only be considered if the rate of change is below a threshold amount (e.g., three-phase motor current having a rate of change at or above the threshold amount may be excluded). In some embodiments, depending on whether the driving switch that experienced the DESAT fault was on the low or high side of the inverter, the polarity of the asymmetrical short current (e.g., positive or negative) may be used to determine if the DESAT fault was a fail short or a fail open (e.g., and whether the DESAT fault was on a high or low side of the first inverter 102A). In some embodiments, the current analysis module 202 may analyze the positive and negative current peaks to distinguish between uncontrolled generator (UCG) current (e.g., generated based on the back EMF of the motor that continues to turn based on the motion of the vehicle 101) and two-phase asymmetric short currents. Examples of motor current waveforms for different DESAT faults are described in greater detail with reference to FIGS. 4-6.

In some embodiments, the predetermined time period may be set based on the characteristics of the corresponding motor and inverter (e.g., sufficient time to accurately diagnose the fault without damaging the vehicle hardware). In one example, the predetermined time period is 70 ms. However, this is only one example, and the predetermined time period may be set to any suitable time period. In some embodiments, the current analysis module 202 may initialize the predetermined time period after a buffer time period (e.g., to filter out immediate current transients as a result of the DESAT fault) has passed since detecting the DESAT fault (and instructing all of the driving switches of the first inverter 102A to open). In one example, the buffer time period is 2 ms.

As shown, the current analysis module 202 may provide current waveform information to decision module 204, which may generate a fault action after the predetermined time period has passed. Based on the generated fault action, the control circuitry 116 may control both the first and second inverters 102A and 102B to maximize hardware protection after the DESAT fault. For example, the control circuitry 116 may control the first and second inverters 102A and 102B to minimize asymmetrical short circuit current duration, prevent the backflow of UCG current to the battery 108, and minimize unwanted torque that would be caused by simply controlling driving switches of both inverters to open until the vehicle 101 comes to a stop. For example, the control circuitry 116 may control the first and second inverters 102A and 102B based on the fault action table 300 of FIG. 3.

FIG. 3 shows an example of a fault action table 300, in accordance with some embodiments of the present disclosure. As shown, based on the identified DESAT type 302 and the motor speed (i.e., "Speed"), a fault action 304 and an inverter health 306 are determined. As shown, the determined fault action 304 may be one from among OPEN, Short Lo, Short Hi, Speed-Dependent Hi, and Speed-Dependent Hi, while the inverter health 306 may be operational or not operational. As shown, the DESAT type 302 may indicate the driving switch or switches that failed (e.g., high-side switches or low-side switches) and the type of failure (e.g., failed short or failed open). A fail short is a condition when the driving switch experiencing the DESAT fault is not controllable and will permanently act as a short circuit. A fail OPEN is a condition when the driving switch experiencing DESAT fault is turned off in time to avoid damage (e.g., by the protection circuitry of the control circuitry 116) and is in a healthy state. This switch is immediately OPEN after the fault; however, it is controllable after the ECU or drive system controller is reset (e.g., ECU).

In some embodiments, a "lower switch fail short" indicates that one of the low-side switches of the inverter where the DESAT fault was detected (e.g., one of low-side driving switches S2A, S4A, or S6A of the first inverter 102A) failed short. A "higher switch fail short" indicates that one of the high-side switches of the inverter where the DESAT fault was detected (e.g., one of high-side driving switches S1A, S3A, or S5A) failed short. The control circuitry 116 issues gate drive control signals based on the determined fault action 304. For example, based on the determined fault action 304, the control circuitry 116 controls the inverter, as explained in further detail below.

In response to an "OPEN" fault action, the control circuitry 116 instructs all of the driving switches of the inverter to open. A "Short Lo" fault action causes the control circuitry 116 to control the remaining low-side driving switches to close and all of the high-side driving switches to remain open (e.g., following the open command when the DESAT fault was first detected). A "Short Hi" fault action causes the control circuitry 116 to instruct the remaining high-side driving switches to close and all of the low-side driving switches to remain open (e.g., following the open command when the DESAT fault was first detected). A "Speed-Dependent Hi" fault action is a speed-dependent fault action. For example, in response to the speed of the motor being above a threshold speed, the Speed-Dependent Hi fault action causes the control circuitry 116 to instruct all of the high-side driving switches to close and the remaining low-side driving switches to remain open while the speed of the coupled motor remains above the threshold speed. Once the motor speed drops to (or below) the threshold speed (e.g., such that the UCG current is low enough not to damage the drive system 100), the Speed-Dependent Hi fault action controls all of the remaining switches to open or remain open. A "Short-Dependent Lo" fault action is a speed-dependent fault action. For example, in response to the speed of the motor being above a threshold speed, the Speed-Dependent Lo fault action controls all of the low-side driving switches to close and the remaining high-side driving switches to remain open while the speed of the motor remains above the threshold speed. Once the speed drops to (or below) the threshold speed (e.g., such that the UCG current is low enough not to damage the drive system 100), the Speed-Dependent Lo fault action controls all of the remaining switches to open or remain open. As shown, the control circuitry 116 is able to control the inverters when more than one switch of an inverter fails. As exampled in further detail below, control circuitry 116 controls the driving switches of the inverter that did not experience the DESAT fault (e.g., the second inverter 102B) to correspond to the control of the driving switches of the inverter that experienced the fault (e.g., the first inverter 102A). Thus, any induced yaw (e.g., by unequal torques) will be limited to the current analysis period (e.g., 70 ms), which may not be perceived by a driver of the vehicle 101.

Figure 4:
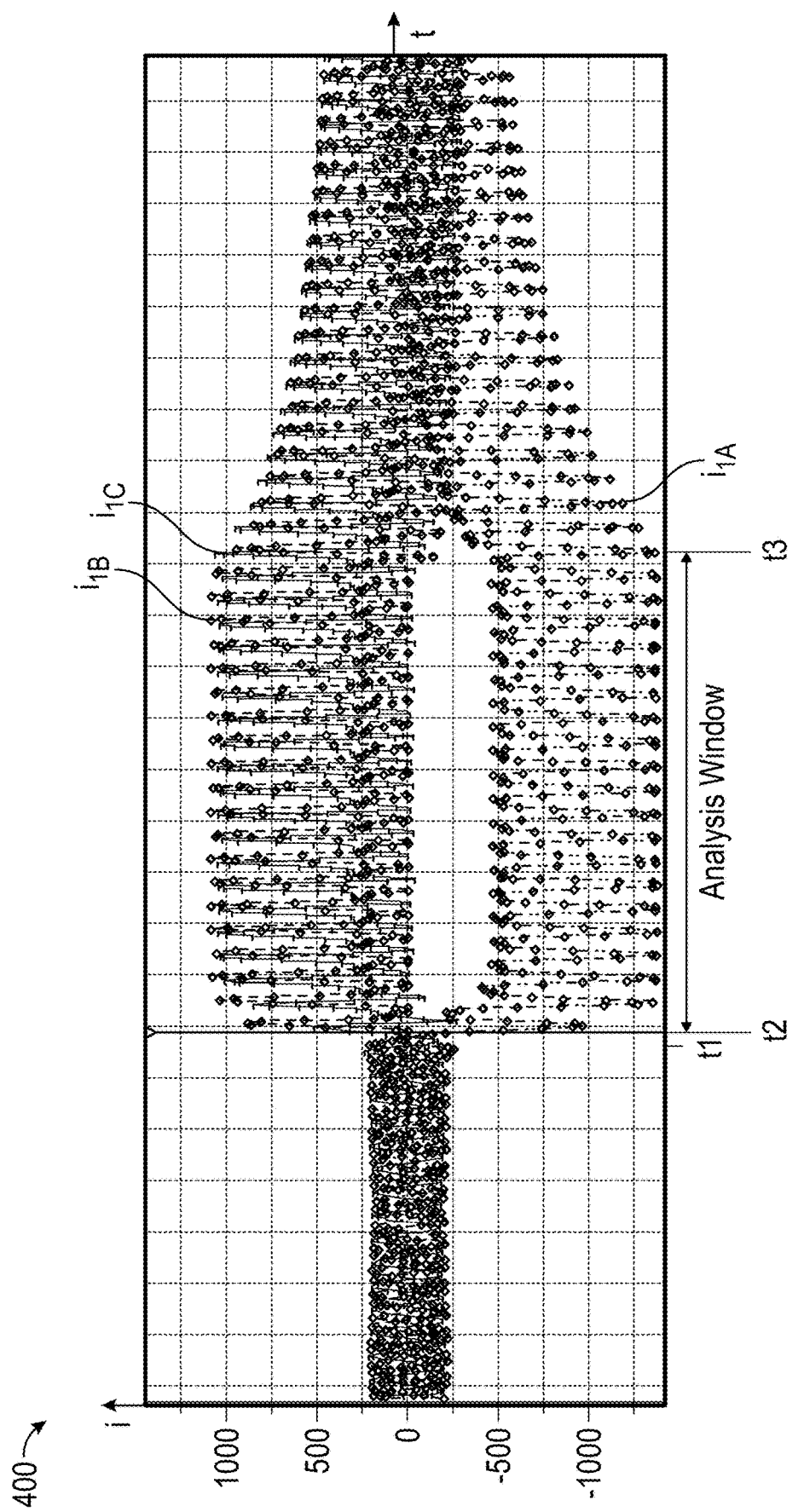
FIG. 4 shows example waveforms (e.g., motor currents $1_{1A}$, $1_{1B}$, and $i_{1C}$ of a first motor) during a low-side driving switch fail short DESAT fault, in accordance with some embodiments of the present disclosure.

FIG. 4 shows example waveforms 400 (e.g., motor currents $i_{1A}$, $i_{1B}$, and $i_{1C}$ of the first motor 110A) during a low-side driving switch fail short DESAT fault (e.g., driving switch S2A of the first inverter 102A), in accordance with some embodiments of the present disclosure. As shown, at time t1, driving switch S2A experiences a DESAT fault. In response, the control circuitry 116 immediately instructs all of the driving switches (e.g., driving switches S1A-S6A) of the first inverter 102A to open. At time t2, after a buffer time period (e.g., 2 ms) has passed, the current analysis module 202 analyzes the illustrated motor current $i_{1A}$, $i_{1B}$, and $i_{1C}$. As shown, in the failed inverter leg (e.g., the first inverter leg 102A), asymmetrical current flows through the shorted driving switch (S2A), while in the other inverter legs (e.g., the second and third inverter legs 104A and 106A), the asymmetrical current flows through the anti-parallel diodes. As shown, because a low-side driving switch (S2A) experienced the fault, one of the current waveforms (e.g., $i_{1A}$) is negative, while the other two current waveforms (e.g., $i_{1B}$ and $i_{1C}$) are positive. By analyzing the current waveforms during the current analysis window (e.g., from time t2 to time t3), the current analysis module 202 may determine that the low-side driving switch S2A has failed short. At time t3, in response to the control circuitry 116 controlling the driving switches of the first inverter 102A based on the determined fault (e.g., "Short Lo"), the motor currents begin to decrease as the vehicle 101 comes to a stop.

Figure 5:
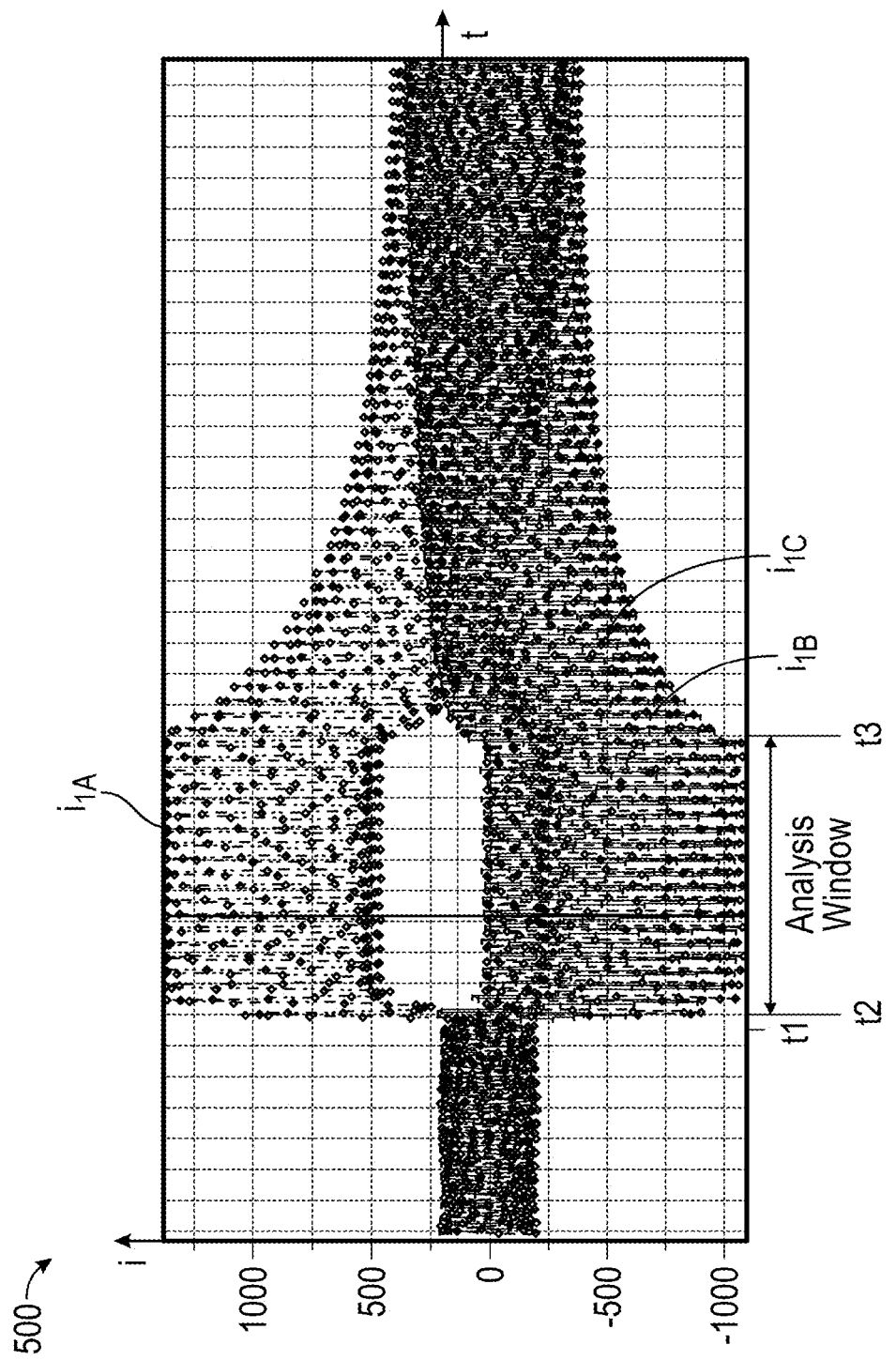
FIG. 5 shows example waveforms (e.g., motor currents $i_{1A}$, $i_{1B}$, and $i_{1C}$ of the first motor) during a high-side driving switch fail short DESAT fault, in accordance with some embodiments of the present disclosure.

FIG. 5 shows example waveforms 500 (e.g., motor currents $i_{1A}$, $i_{1B}$, and $i_{1C}$ of the first motor 110A) during a high-side driving switch fail short DESAT fault (e.g., driving switch S1A of the first inverter 102A), in accordance with some embodiments of the present disclosure. As shown, at time t1, driving switch S1A experiences a DESAT fault. In response, the control circuitry 116 immediately instructs all of the driving switches of the first inverter 102A to open. At time t2, after a buffer time period (e.g., 2 ms) has passed, the current analysis module 202 analyzes the illustrated motor current $i_{1A}$, $i_{1B}$, and $i_{1C}$. As shown, in the failed inverter leg (e.g., the first inverter leg 102A), asymmetrical current flows through the shorted driving switch (S1A), while in the other inverter legs (e.g., the second and third inverter legs 104A and 106A), the asymmetrical current flows through the anti-parallel diodes. As shown, because a high-side driving switch (S1A) experienced the fault, one of the current waveforms (e.g., 11A) is positive, while the other two current waveforms (e.g., $i_{1B}$ and $i_{1C}$) are negative. By analyzing the current waveforms during the current analysis window (e.g., from time t2 to time t3), the current analysis module 202 may determine that the high-side driving switch S2A has failed short. At time t3, in response to the control circuitry 116 controlling the driving switches of the first inverter 102A based on the determined fault (e.g., "Short Hi"), the motor currents begin to decrease as the vehicle 101 comes to a stop.

Figure 6:
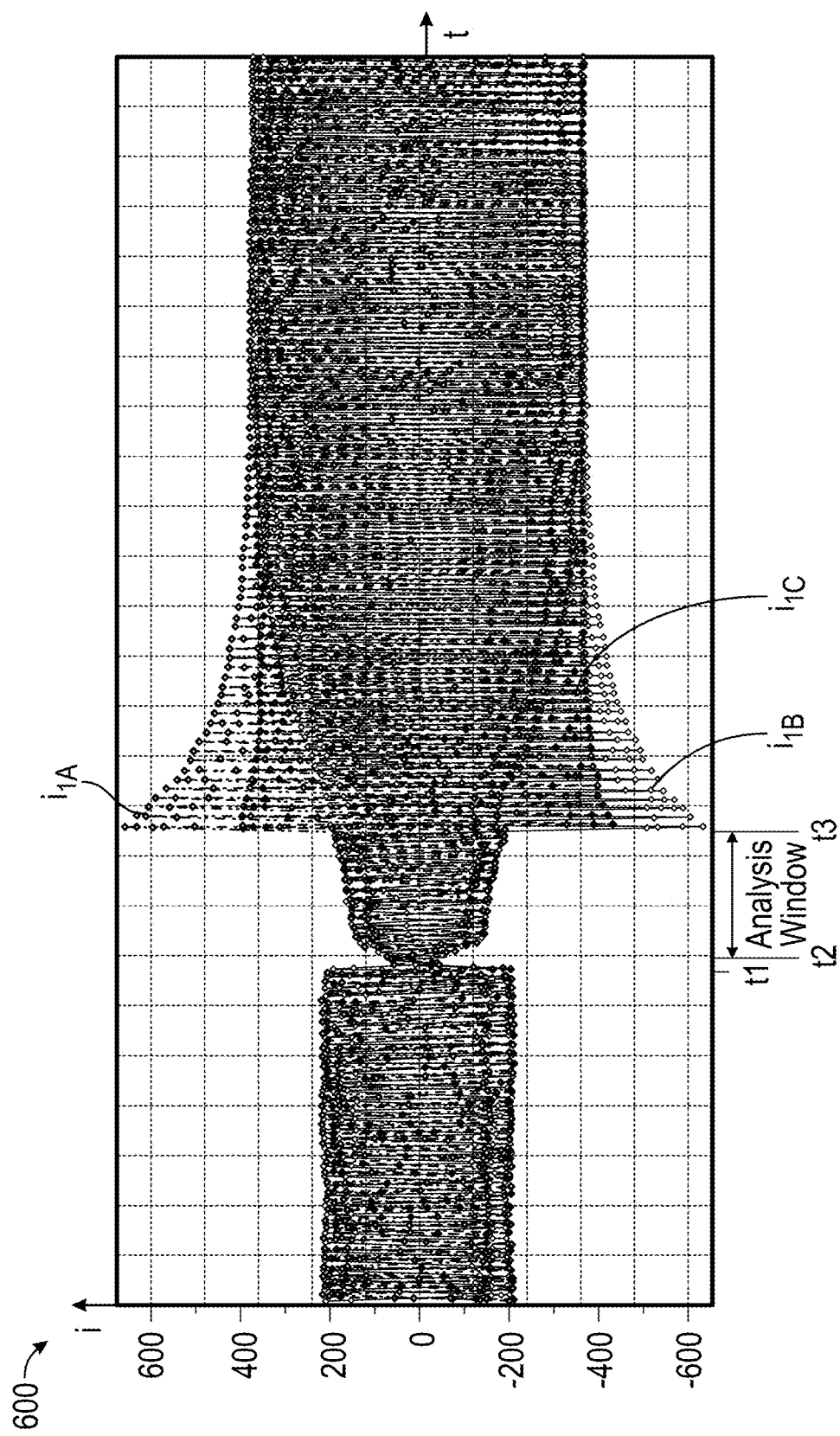
FIG. 6 shows example waveforms (e.g., motor currents $i_{1A}$, $i_{1B}$, and $i_{1C}$ of the first motor) during a low-side driving switch fail open DESAT fault, in accordance with some embodiments of the present disclosure.

FIG. 6 shows example waveforms 600 (e.g., motor currents $i_{1A}$, $i_{1B}$, and $i_{1C}$ of the first motor 110A) during a low-side driving switch fail open DESAT fault (e.g., driving switch S2A of the first inverter 102A), in accordance with some embodiments of the present disclosure. As shown, at time t1, driving switch S2A experiences a DESAT fault. In response, the control circuitry 116 immediately instructs all of the driving switches of the first inverter 102A to open. At time t2, after a buffer time period (e.g., 2 ms) has passed, the current analysis module 202 analyzes the illustrated motor current $i_{1A}$, $i_{1B}$, and $i_{1C}$. A three-phase motor current (e.g., UCG current) flows through the anti-parallel diodes. As shown, the magnitudes of the currents are lower than an asymmetrical short currents, the polarity of the currents for all phases changes periodically, and each phase has positive and negative peaks that have equal absolute values. By analyzing the current waveforms during the current analysis window (e.g., from time t2 to time t3), the current analysis module 202 may determine that the low-side driving switch S2A has failed OPEN. At time t3, in response to the control circuitry 116 controlling the driving switches of the first inverter 102A based on the determined fault (e.g., "Speed-Dependent Hi"), the motor currents begin to decrease as the vehicle 101 comes to a stop.

As is understood, the current analysis module 202 may analyze other current waveforms to determine the other faults (e.g., single or multiple switch DESAT faults) illustrated in FIG. 3. For example, if the current analysis module 202 determined that a high-side driving switch experienced a fail open DESAT fault (e.g., driving switch S1A of the first inverter 102A), control circuitry 116 would control the driving switches of the first inverter 102A based on the determined fault (e.g., "Speed-Dependent Low").

Figure 7:
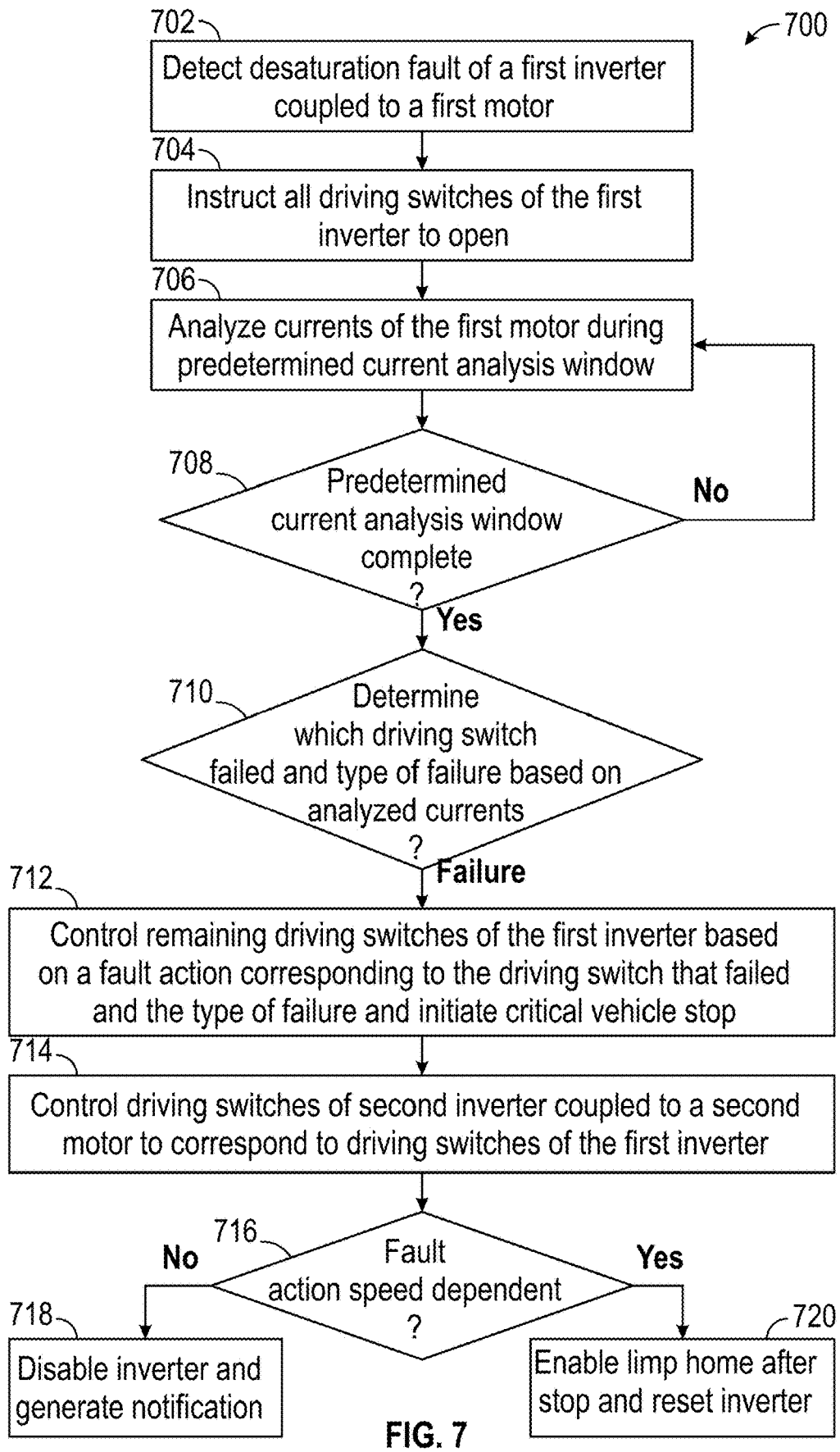
FIG. 7 depicts an illustrative flowchart of a process for responding to a DESAT fault, in accordance with some embodiments of the present disclosure.

FIG. 7 depicts an illustrative flowchart of a process 700 for responding to a detected DESAT fault, in accordance with some embodiments of the present disclosure. The process 700 may be performed at least in part by the control circuitry 116 of FIG. 1.

At 702, the control circuitry 116 detects a DESAT fault of a first inverter (e.g., the first inverter 102A). For example, the control circuitry may receive a DESAT fault signal from DESAT detector 114A.

In some embodiments, the control circuitry 116 may also verify that the DESAT fault signal was generated in response to an actual DESAT fault (e.g., and not an improperly triggered DESAT fault). If the control circuitry 116 determines that the operation of the inverter is normal (e.g., that no driving switch experienced a DESAT fault), the process 700 ends (e.g., until a new DESAT fault is detected). Otherwise, the process proceeds to 704. In some embodiments, this DESAT fault verification step may be performed at any suitable time during the process 700 (e.g., during/after steps 706, 708, or 710).

At 704, the control circuitry 116 instructs all the driving switches (e.g., driving switches S1A-S6A) of the first inverter to open in response to detecting the DESAT fault.

At 706, the control circuitry 116 analyzes the currents of the motor during a predetermined current analysis window (e.g., a predetermined time period). In some embodiments, the control circuitry 116 analyzes characteristics of the currents (e.g., the polarity, magnitude, peaks, etc.) to determine the type(s) of DESAT fault and how current is flowing through the inverter. For example, with reference to any of FIGS. 4-6, during the predetermined current analysis window from time t2-t3, the control circuitry 116 may analyze motor currents $i_{1A}$, $i_{1B}$, and $i_{1C}$ to determine the number of positive peaks and negative peaks of the motor currents. Based on the number of positive peaks and the polarity and magnitude of the motor currents, the control circuitry 116 may determine that the DESAT fault is a fail short and the phase in which the fault occurred (e.g., based on the polarity). Similarly, based on the number of positive peaks to the number of negative peaks, the control circuitry 116 may determine that the DESAT fault is a fail open and that a UCG current is being generated. For example, the number of times that the positive peak is reached for each phase should be equal to the number of times the negative peak is reached for each phase (e.g., with a dead band that depends on the hardware of the drive system).

In some embodiments, the predetermined time period may begin after a buffer time period (e.g., to filter out any unwanted transient currents after the DESAT fault) has passed since instructing all the driving switches to open. However, this is only one example, and the control circuitry 116 may perform any suitable action to filter out unwanted current spikes.

At 708, the control circuitry 116 determines if the predetermined current analysis window is complete. For example, the control circuitry 116 analyzes the currents of the motor (e.g., the first motor 110A) for the predetermined time period (e.g., 70 ms) before making the fault determination in step 710).

At 710, the control circuitry 116 determines which driving switch has failed and the type of failure based on the analyzed currents. For example, as described above, the control circuitry 116 may determine if one or more high-side switches failed short or failed OPEN.

At 712, the control circuitry 116 controls the remaining driving switches of the first inverter based on a fault action corresponding to the driving switch that failed and the type of failure and initiates a critical vehicle stop. For example, as shown in FIG. 3, based on the determination of the driving switch that failed (e.g., a low-side driving switch or a high-side driving switch) and the type of failure (e.g., failed short or failed OPEN) (e.g., DESAT type 302), the control circuitry 116 controls the remaining driving switches of the first inverter based on the determined fault action 304 (e.g., OPEN, Short Lo, Short Hi, Speed-Dependent Hi, Speed-Dependent Lo).

At 714, the control circuitry 116 control the driving switches of a second inverter (e.g., the second inverter 102B) coupled to a second motor to correspond to the control of the driving switches of the first inverter 102A. That is, the control circuitry 116 controls the driving switches (e.g., driving switches S1B-S6B) of the second inverter based on the determined fault action in 714. In some embodiments, if the vehicle 101 includes more than two inverters, the control circuitry 116 may also control the driving switches of the additional inverter(s) based on the determined fault action in 712.

At 716, the control circuitry 116 determines if the fault action is speed dependent. For example, as illustrated in FIG. 3, the control circuitry 116 determines the status of the inverter health 306 (e.g., "operational" or "not operational"). In response to determining that the fault action is not speed dependent ("No" at 716), the process 700 proceeds to 718. Otherwise ("Yes" at 716), the process proceeds to 720.

At 718, the control circuitry 116, in response to determining that the fault action is not speed dependent, disables both the first and second inverter and generates a notification that the vehicle 101 is not operational. In some embodiments, the control circuitry 116 may allow limited operation of the inverter that did not experience the DESAT fault to allow the vehicle 101 to reach a safe spot to park.

At 720, the control circuitry 116, in response to determining that the fault action is speed dependent, enables a limp home mode after the vehicle 101 has come to a stop. The limp home mode may allow the vehicle 101 to be drive using the opposite axle motor and inverter. In some embodiments, during the next sleep cycle of the vehicle 101, the control circuitry 116 may attempt to reset the inverter. If the reset is successful, the control circuitry 116 may clear the fault and the vehicle may be driven normally.

The processes discussed above are intended to be illustrative and not limiting. One skilled in the art would appreciate that the steps of the processes discussed herein may be omitted, modified, combined and/or rearranged, and any additional steps may be performed without departing from the scope of the invention. For example, if the vehicle 101 includes only a single inverter, step 714 may be omitted. Similarly, if the vehicle 101 includes more than two inverters, step 714 may be performed for each additional inverter (e.g., in excess of two).

The foregoing is merely illustrative of the principles of this disclosure, and various modifications may be made by those skilled in the art without departing from the scope of this disclosure. The above-described embodiments are presented for purposes of illustration and not of limitation. The present disclosure also can take many forms other than those explicitly described herein. Accordingly, it is emphasized that this disclosure is not limited to the explicitly disclosed methods, systems, and apparatuses, but is intended to include variations thereto and modifications thereof, which are within the spirit of the following claims.

What is claimed is:

1. A method comprising:
   instructing all driving switches of a high-side and a low-side of an inverter coupled to a motor to open simultaneously for a predetermined time period in response to detecting a desaturation fault;
   determining a failed driving switch of a side of the high-side or the low-side and a type of failure based on current of the motor during the predetermined time period; and
   in response to determining that the type of failure is a fail short, controlling the remaining driving switches of the side of the failed driving switch to close and the driving switches of the other side to remain open if a speed of the motor is above a threshold; or
   in response to determining that the type of failure is a fail open, controlling the remaining driving switches of the side of the failed driving switch to remain open and the driving switches of the other side to close while a speed of the motor is above a threshold.

2. The method according to claim 1, wherein the current of the motor includes a plurality of currents each corresponding to a phase of the motor, and determining the failed driving switch and the type of failure comprises analyzing the current of the motor.

3. The method according to claim 2, wherein the predetermined time period begins after a buffer time period has passed since instructing all the driving switches to open.

4. The method according to claim 1, wherein:
   the inverter comprises a plurality of legs; and
   in response to determining that the type of failure is a fail short:

and in response to the speed of the motor being at or below a threshold speed, controlling the remaining driving switches that have not failed to remain open.

5. The method according to claim 1, wherein:
the inverter comprises a plurality of legs; and
in response to determining that the type of failure is a fail open; and
in response to the speed of the motor being at or below the threshold speed, controlling all of the remaining driving switches that have not failed to open or remain open.

6. The method according to claim 1, further comprising:
determining whether the inverter is operational based on the determined type of failure;
in response to determining that the inverter is operational, resetting the inverter; and
in response to determining that the inverter is not operational, disabling the inverter and generating a notification that the inverter is not operational.

7. The method according to claim 1, wherein the inverter is a first inverter and the motor is a first motor, the method further comprising controlling driving switches of a second inverter coupled to a second motor to correspond to the driving switches of the first inverter.

8. The method according to claim 7, wherein:
each of first motor and the second motor is a three-phase electric motor; and
the first motor is coupled to a first wheel of a vehicle and the second motor is coupled to a second wheel of the vehicle.

9. A system comprising:
an inverter configured to be coupled to a motor and comprising a plurality of driving switches each arranged on a high-side or a low-side; and
control circuitry configured to:
 instruct all driving switches of the high-side and the low-side to open simultaneously for a predetermined time period in response to detecting a desaturation fault;
 determine a failed driving switch of a side of the high-side or the low-side and a type of failure based on current of the motor during the predetermined time period; and
  in response to determining that the type of failure is a fail short, control the remaining driving switches of the side of the failed driving switch to close and the driving switches of the other side to remain open if a speed of the motor is above a threshold; or
  in response to determining that the type of failure is a fail open, control the remaining driving switches of the side of the failed driving switch to remain open and the driving switches of the other side to close while a speed of the motor is above a threshold.

10. The system according to claim 9, wherein:
the current of the motor includes a plurality of currents each corresponding to a phase of the motor; and
the control circuitry is configured to determine the failed driving switch and the type of failure by analyzing the current of the motor during the predetermined time period.

11. The system according to claim 9, wherein:
the inverter comprises a plurality of legs, each of the plurality of legs comprising a high-side driving switch of the plurality of driving switches and a low-side driving switch of the plurality of driving switches; and
the control circuitry is configured to, in response to determining that the type of failure is a fail short and in response to the speed of the motor being at or below a threshold speed, control the remaining driving switches that have not failed to remain open.

12. The system according to claim 9, wherein:
the inverter comprises a plurality of legs, each of the plurality of legs comprising a high-side driving switch of the plurality of driving switches and a low-side driving switch of the plurality of driving switches; and
the control circuitry is configured to, in response to determining that the type of failure is a fail open; and
in response to the speed of the motor being at or below the threshold speed, control all of the remaining driving switches that have not failed to open or remain open.

13. The system according to claim 9, wherein:
the inverter is a first inverter and the motor is a first motor,
each of the first motor and a second motor is a three-phase electric motor;
the first motor is coupled to a first wheel of a vehicle and the second motor is coupled to a second wheel of the vehicle; and
the control circuitry is further configured to control switches of a second inverter coupled to the second motor to correspond to the driving switches of the first inverter.

14. A vehicle comprising:
a first inverter coupled to a first motor, wherein the first motor is coupled to a first wheel of the vehicle;
a second inverter coupled to a second motor, wherein the second motor is coupled to a second wheel of the vehicle; and
control circuitry configured to:
 instruct all driving switches of a high-side and a low-side of the first inverter to open simultaneous for a predetermined time period in response to detecting a desaturation fault;
 determine a failed driving switch of a side of the high-side or the low-side of the first inverter and a type of failure based on current of the first motor during the predetermined time period;
 in response to determining that the type of failure is a fail short, control the remaining driving switches of the first inverter of the side of the failed driving switch to close and the driving switches of the other side to remain open if a speed of the first motor is above a threshold;
 in response to determining that the type of failure is a fail open, control the remaining driving switches of the side of the failed driving switch to remain open and the driving switches of the other side to close while a speed of the first motor is above a threshold; and
 control all driving switches of the second inverter to correspond to the driving switches of the first inverter.

15. The vehicle of claim 14, wherein:
wherein the current of the first motor includes a plurality of currents each corresponding to a phase of the first motor; and
the control circuitry is configured to determine the failed driving switch of the first inverter and the type of failure by analyzing the current of the first motor.

16. The vehicle of claim 14, wherein the control circuitry is further configured to:

determine whether the first inverter is operational based on the determined type of failure;

in response to determining that the first inverter is operational, reset the first inverter; and in response to determining that the first inverter is not operational, disable the first inverter and the second inverter and generate a notification that the vehicle is not operational.

\* \* \* \* \*